US006973109B2

United States Patent
Fukunaga et al.

(10) Patent No.: US 6,973,109 B2
(45) Date of Patent: Dec. 6, 2005

(54) SEMICONDUCTOR LASER DEVICE HAVING STRAIN BUFFER LAYER BETWEEN COMPRESSIVE-STRAIN QUANTUM WELL LAYER AND TENSILE-STRAIN BARRIER LAYER

(75) Inventors: Toshiaki Fukunaga, Kaisei-machi (JP); Mitsugu Wada, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 508 days.

(21) Appl. No.: 09/794,618

(22) Filed: Feb. 28, 2001

(65) Prior Publication Data

US 2001/0017875 A1 Aug. 30, 2001

(30) Foreign Application Priority Data

Feb. 28, 2000 (JP) .................... 2000-050766

(51) Int. Cl.⁷ .................... H01S 5/00
(52) U.S. Cl. .................... 372/43; 372/44; 372/45; 257/18
(58) Field of Search .................... 372/43, 44, 45, 372/46, 50; 257/18

(56) References Cited

U.S. PATENT DOCUMENTS

| | | | | |
|---|---|---|---|---|
| 4,845,724 A | * | 7/1989 | Hayakawa et al. | 372/45 |
| 4,961,197 A | * | 10/1990 | Tanaka et al. | 372/45 |
| 5,136,601 A | * | 8/1992 | Kajimura et al. | 372/45 |
| 5,272,109 A | * | 12/1993 | Motoda | 372/45 |
| 5,671,242 A | | 9/1997 | Takiguchi et al. | 372/45 |
| 5,825,796 A | * | 10/1998 | Jewell et al. | 372/45 |
| 5,929,462 A | * | 7/1999 | Kasukawa et al. | 257/18 |
| 6,023,484 A | * | 2/2000 | Matsumoto et al. | 372/45 |
| 6,028,874 A | * | 2/2000 | Wada et al. | 372/45 |
| 6,229,152 B1 | * | 5/2001 | Dries et al. | 257/18 |
| 6,233,264 B1 | * | 5/2001 | Sato | 372/45 |
| 6,285,695 B1 | * | 9/2001 | Asano et al. | 372/45 |

FOREIGN PATENT DOCUMENTS

| | | | | |
|---|---|---|---|---|
| JP | 8-78786 | | 3/1996 | H01S/3/18 |
| JP | 08078786 A | * | 3/1996 | H01S/3/18 |
| JP | 08-139404 A | * | 5/1996 | H01S/3/18 |

* cited by examiner

Primary Examiner—Mingun Oh Harvey
Assistant Examiner—Cornelius H Jackson
(74) Attorney, Agent, or Firm—Sughrue Mion, PLLC

(57) ABSTRACT

A semiconductor laser device having an active region including alternating layers of at least one quantum well layer and a plurality of barrier layers, where two of the plurality of barrier layers are the outermost layers of the alternating layers. Each of the at least one quantum well layer has a compressive strain, and each of the plurality of barrier layers has a tensile strain. In the active region, a strain buffer layer having an intermediate strain is formed between each quantum well layer and each of two barrier layers adjacent to the quantum well layer. Interfacial strain is thus reduced, improving high-output-power characteristics.

26 Claims, 9 Drawing Sheets

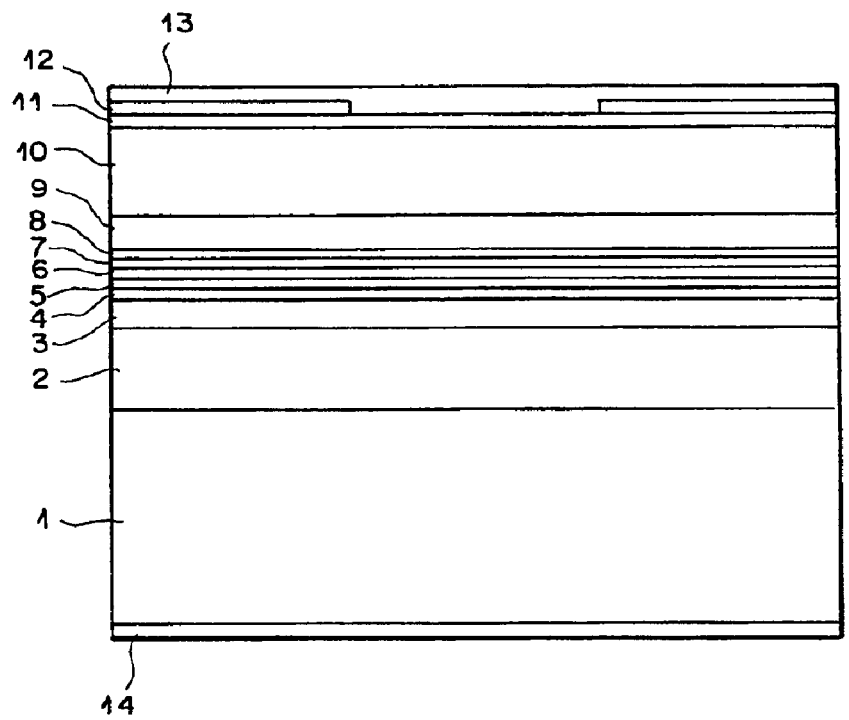
F I G . 1

F I G. 2A
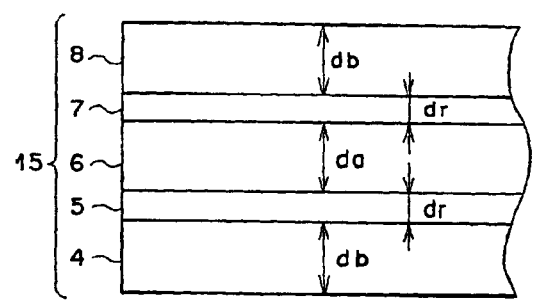
F I G. 2B
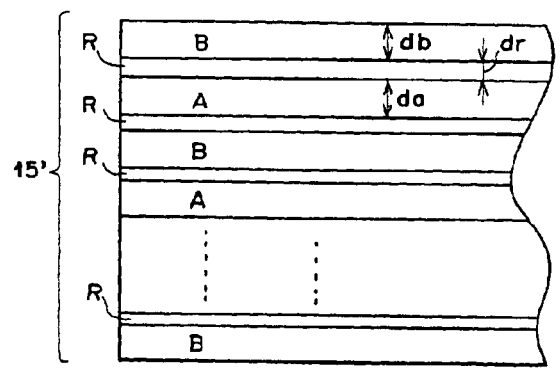

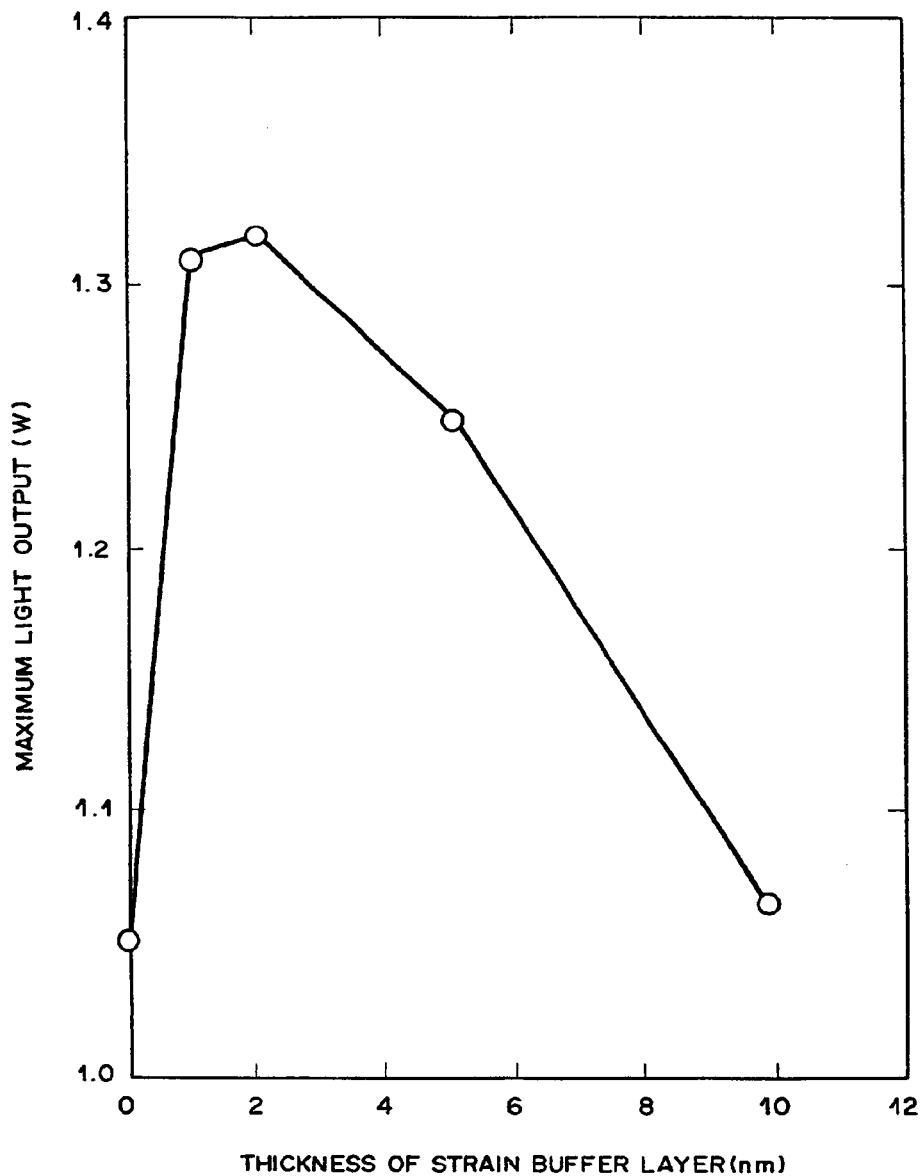

SEMICONDUCTOR LASER DEVICE HAVING STRAIN BUFFER LAYER BETWEEN COMPRESSIVE-STRAIN QUANTUM WELL LAYER AND TENSILE-STRAIN BARRIER LAYER

BACKGROUND OF THE INVENTION

1. Field of the Invention

The present invention relates to a semiconductor laser device having at least one compressive-strain quantum well layer and tensile-strain barrier layers.

2. Description of the Related Art

Conventionally, semiconductor laser devices having an active region in which at least one compressive-strain quantum well layer and tensile-strain barrier layers are alternately laminated have been proposed.

For example, Japanese Unexamined Patent Publication, No. 8(1996)-78786 discloses a stress-compensation semiconductor laser device in which compressive-strain quantum well layers and tensile-strain barrier layers are alternately laminated so that the overall average of the strains in the active region is a compressive strain. However, when the active region has such a construction, the difference in the strain between the compressive-strain quantum well layers and tensile-strain barrier layers increases with the increase in the compressive strains. Therefore, a great interfacial strain occurs at the boundaries between the compressive-strain quantum well layers and tensile-strain barrier layers. Thus, it becomes difficult to realize high crystallinity without an interfacial defect.

Further, T. Fukunaga et al. ("Reliable Operation of Strain-Compensated 1.06 µm InGaAs/InGaAsP/GaAs Single Quantum Well Lasers," Applied Physics Letters, vol. 69, No. 2, 1996, pp. 248–250) report that the reliability of a semiconductor laser device including an InGaAs compressive-strain quantum well active layer and a GaAs substrate is increased by providing tensile-strain barrier layers adjacent to the quantum well layer and compensating for the strain. However, the reliability and high-output-power characteristics of the above semiconductor laser device are not yet practicable.

SUMMARY OF THE INVENTION

An object of the present invention is to provide a semiconductor laser device including in an active region at least one compressive-strain quantum well layer and tensile-strain barrier layers, in which an interfacial strain is reduced, and high-output-power characteristics are improved.

(1) According to the present invention, there is provided a semiconductor laser device comprising an active region which includes alternating layers of at least one quantum well layer and a plurality of barrier layers, where two of the plurality of barrier layers are outermost layers of the alternating layers, each of the at least one quantum well layer has a first thickness da and a compressive strain $\Delta a$, and each of the plurality of barrier layers has a second thickness db and a tensile strain $\Delta b$. In the active region, a strain buffer layer is formed between each of the at least one quantum well layer and each of two barrier layers adjacent to the quantum well layer, where each strain buffer layer has a third thickness dr and an intermediate strain $\Delta r$ which is between the compressive strain $\Delta a$ and the tensile strain $\Delta b$. The first thickness da, the compressive strain $\Delta a$, the second thickness db, the tensile strain $\Delta b$, the third thickness dr, and the intermediate strain $\Delta r$ satisfy a relationship, $$0 \leq N \cdot \Delta a \cdot da + (N+1) \cdot \Delta b \cdot db + 2N \cdot \Delta r \cdot dr \leq 0.08 \text{ nm},$$

where N is the number of the at least one quantum well layer.

The intermediate strain $\Delta r$ between the compressive strain $\Delta a$ and the tensile strain $\Delta b$ means that $\Delta a < \Delta r < \Delta b$. Preferably, the intermediate strain $\Delta r$ is a compressive strain.

The strains of the quantum well layer, the barrier layer, and the strain buffer layer are respectively defined as $\Delta a = (c_a - c_s)/c_s$, $\Delta b = (c_b - c_s)/c_s$, and $\Delta r = (c_r - c_s)/c_s$, where $c_s$, $c_a$, $c_b$, and $c_r$ are the lattice constants of a (GaAs) substrate, the quantum well layer, the barrier layer, and the strain buffer layer, respectively.

When the above relationship is satisfied, the probability of occurrence of lattice defects due to the strain in the quantum well layer can be reduced. Therefore, the semiconductor laser device can oscillate in the fundamental transverse mode with high repeatability even when the output power is high. Thus, the reliability of the semiconductor laser device can be increased.

Since the tensile-strain barrier layer, which has a great band gap, is provided in the semiconductor laser device according to the present invention, leakage current can be reduced. In addition, since the strain buffer layer is provided between the tensile-strain barrier layer and the compressive-strain quantum well layer, the quality of the quantum well layer can be improved. Therefore, non-radiative recombination components can be reduced. Thus, it is possible to realize a reliable semiconductor laser device.

For example, in the case of a single quantum well structure, i.e., $N=1$, $0 \leq \Delta a \cdot da + 2\Delta b \cdot db + 2 \Delta r \cdot dr \leq 0.08$ nm. Preferably, $0.01 \text{ nm} \leq \Delta a \cdot da + 2\Delta b \cdot db + 2 \Delta r \cdot dr \leq 0.06$ nm. More preferably, $0.012 \text{ nm} \leq \Delta a \cdot da + 2\Delta b \cdot db + 2 \Delta r \cdot dr \leq 0.04$ nm.

Preferably, the semiconductor laser device according to the present invention may also have one or any possible combination of the following additional features (i) to (x).

(i) The at least one quantum well layer may be made of $In_{x1}Ga_{1-x1}As_{1-y1}P_{y1}$, each of the plurality of strain buffer layers may have a thickness of approximately 1 to 5 nm, and may be made of $In_{x2}Ga_{1-x2}As_{1-y2}P_{y2}$, and each of the plurality of barrier layers may have a thickness of approximately 5 to 20 nm, and may be made of $In_{x3}Ga_{1-x3}As_{1-y3}P_{y3}$, where $0.4 \leq x1 > 0.49y1$, $0 \leq y1 \leq 0.1$, $0 \leq x2 \leq 0.4$, $0 \leq y2 \leq 0.5$, $0 \leq x3 < 0.49y3$, and $0 < y3 \leq 0.5$.

(ii) The semiconductor laser device according to the present invention may further comprise an upper optical waveguide layer formed on or above the active region, and a lower optical waveguide layer formed under the active region. Each of the upper optical waveguide layer and the lower optical waveguide layer may be made of $In_{x4}Ga_{1-x4}As_{1-y4}P_{y4}$ or $Al_{z3}Ga_{1-z3}As$, where $x4=(0.49\pm0.01)y4$, $0 \leq x4 \leq 0.3$, and $0 \leq z3 \leq 0.3$.

(iii) The semiconductor laser device according to the present invention may further comprise an upper cladding layer formed on or above the upper optical waveguide layer, and a lower cladding layer formed under the lower optical waveguide layer. Each of the upper cladding layer and the lower cladding layer may be made of $In_{x7}(Al_{z7}Ga_{1-z7})_{1-x7}P$ or $Al_{z1}Ga_{1-z1}As$ or $In_{x8}Ga_{1-x8}P$, where $x7=0.49\pm0.01$, $0 \leq z7 \leq 1$, $0.2 \leq z1 \leq 0.7$, and $x8=0.49\pm0.01$.

(iv) The semiconductor laser device according to the present invention may have a stripe structure.

(v) The stripe structure in the feature of (iv) may be realized by a current confinement layer formed above the active region, where the current confinement layer has an opening having a stripe shape and realizing a current injection window.

(vi) In the semiconductor laser device having the additional feature of (v), the current injection window may have a width equal to or greater than 2 micrometers and less than 4 micrometers, and realize a difference in an equivalent refractive index between a portion of the active region under the current injection window and another portion of the active region under the current confinement layer except for the current injection window may be in a range from $1.5 \times 10^{-3}$ to $7 \times 10^{-3}$.

(vii) In the semiconductor laser device having the additional feature of (v), the current injection window may have a width equal to or greater than 4 micrometers, and realize a difference in an equivalent refractive index between a portion of the active region under the current injection window and another portion of the active region under the current confinement layer except for the current injection window may be equal to or greater than $1.5 \times 10^{-3}$.

(viii) The stripe structure in the feature of (iv) may be realized by a ridge structure formed above the active region, where the ridge structure includes a current path.

(ix) In the semiconductor laser device having the additional feature of (viii), the current path may have a width equal to or greater than 2 micrometers and less than 4 micrometers, and realize a difference in an equivalent refractive index between a portion of the active region under the current path and another portion of the active region which is not located under the current path may be in a range from $1.5 \times 10^{-3}$ to $7 \times 10^{-3}$.

(x) In the semiconductor laser device having the additional feature of (viii), the current path may have a width equal to or greater than 4 micrometers, and realize a difference in an equivalent refractive index between a portion of the active region under the current path and another portion of the active region which is not located under the current path may be equal to or greater than $1.5 \times 10^{-3}$.

DESCRIPTION OF THE DRAWINGS

FIG. 1 is a cross-sectional view of a semiconductor laser device as the first embodiment.

FIG. 2A is a magnified cross-sectional view of an active region of a semiconductor laser device including a single quantum well layer.

FIG. 2B is a magnified cross-sectional view of an active region of a semiconductor laser device including multiple quantum well layers.

FIG. 3 is a graph indicating the dependency of the maximum light output power on the thickness of the strain buffer layer in the case where the average strain of the active region is a compressive strain.

DESCRIPTION OF PREFERRED EMBODIMENTS

Figure 4A:
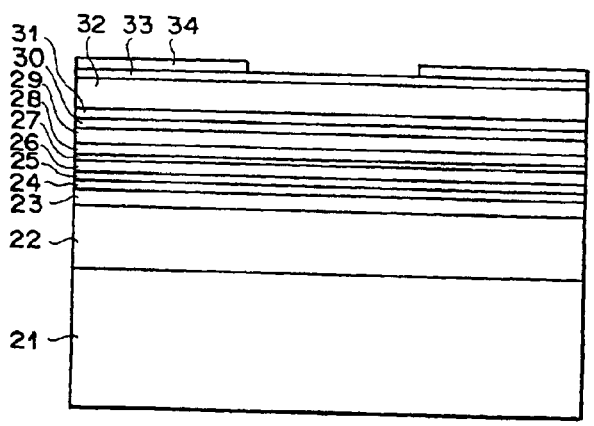
FIGS. 4A to 4C are cross-sectional views of representative stages in the process of producing a semiconductor laser device as the second embodiment.

Embodiments of the present invention are explained in detail below with reference to drawings.

First Embodiment

The construction of a semiconductor laser device as the first embodiment of the present invention and a process for producing the semiconductor laser device are explained below with reference to FIG. 1, which is a cross-sectional view of the semiconductor laser device as the first embodiment, where the cross section is perpendicular to the direction of light emitted from the semiconductor laser device.

As illustrated in FIG. 1, first, an n-type $In_{x8}Ga_{1-x8}P$ lower cladding layer 2 ($x8=0.49\pm0.01$), an n-type or i-type (intrinsic) $In_{x4}Ga_{1-x4}As_{1-y4}P_{y4}$ lower optical waveguide layer 3 ($x4=(0.49\pm0.01)y4$, $0 \leq x4 \leq 0.3$), an $In_{x3}Ga_{1-x3}As_{1-y3}P_{y3}$ tensile-strain barrier layer 4 ($0 \leq x3 < 0.49y3$, $0 < y3 \leq 0.5$) having a thickness of approximately 5 to 20 nm, an $In_{x2}Ga_{1-x2}As_{1-y1}P_{y2}$ strain buffer layer 5 ($0 \leq x2 \leq 0.4$, $0 \leq y2 \leq 0.5$) having a thickness of approximately 1 to 5 nm, an $In_{x1}Ga_{1-x1}As_{1-y1}P_{y1}$ compressive-strain quantum well layer 6 ($0.4 \geq x1 > 0.49y1$, $0 \leq y1 \leq 0.1$) having a thickness of approximately 3 to 20 nm, an $In_{x2}Ga_{1-x2}As_{1-y2}P_{y2}$ strain buffer layer 7, an $In_{x3}Ga_{1-x3}As_{1-y3}P_{y3}$ tensile-strain barrier layer 8, a p-type or i-type $In_{x4}Ga_{1-x4}As_{1-y4}P_{y4}$ upper optical waveguide layer 9, a p-type $In_{x8}Ga_{1-x8}P$ upper cladding layer 10, and a p-type GaAs contact layer 11 are formed on an n-type GaAs substrate 1 by organometallic vapor phase epitaxy. Then, a $SiO_2$ film 12 is formed over the p-type GaAs contact layer 11, and a stripe area of the $SiO_2$ film 12 having a width of about 50 micrometers and extending in the <011> direction is removed by a conventional lithography technique. Next, a p electrode 13 is formed over the above layered construction. In addition, the exposed surface of the substrate 1 is polished, and an n electrode 14 is formed on the polished surface of the substrate 1. Next, both end surfaces of the layered construction are cleaved, and a high reflectance coating and a low reflectance coating are provided on the respective end surfaces so as to form a resonator. Then, the above construction is formed into a chip of a semiconductor laser device as illustrated in FIG. 1.

The above construction is an oxide-stripe type semiconductor laser device. However, instead, an index-guided structure realized by an internal stripe structure or a ridge structure may be formed.

The active region of the semiconductor laser device as the first embodiment is explained below. FIG. 2A is a magnified cross-sectional view of an active region of a semiconductor laser device which includes a single quantum well layer. As described above, the semiconductor laser device as the first embodiment has a single quantum well structure. That is, the quantum well layer 6 is sandwiched between the strain buffer layers 5 and 7, and the quantum well layer 6 and the strain buffer layers 5 and 7 are further sandwiched between the barrier layers 4 and 8.

When the thicknesses of the quantum well layer, each barrier layer, and each strain buffer layer are respectively indicated by da, db, and dr, and the lattice constants of the GaAs substrate, the quantum well layer, each barrier layer, and each strain buffer layer are respectively indicated by $c_s$, $c_a$, $c_b$, and $c_r$, the amounts of strains $\Delta a$, $\Delta b$, and $\Delta r$ of the quantum well layer, each barrier layer, and each strain buffer layer are respectively indicated as $\Delta a = (c_a - c_s)/c_s$, $\Delta b = (c_b - c_s)/c_s$, and $\Delta r = (c_r - c_s)/c_s$.

A relationship between the maximum light output power and the thickness of each strain buffer layer is indicated in FIG. 3 based on five concrete examples of the semiconductor laser device as the first embodiment. In the five concrete examples, the quantum well layer and the barrier layer are fixed, and the thickness of the strain buffer layer is varied. That is, the compositions of the quantum well layer is arranged as x1=0.3 and y1=0, and the strain Δa and the thickness da of the quantum well layer are respectively Δa=2.1% and da=7 nm. The composition of the barrier layer is arranged as x3=0 and y3=0.20, and the strain Δb and the thickness db of the barrier layer are respectively Δb=−0.7% and db=10 nm. The compositions of the strain buffer layer is arranged as x2=0.05 and y2=0, the strain Δr of the strain buffer layer is Δr=0.35%, and the thicknesses dr of the strain buffer layers of the five concrete examples are respectively arranged as dr=0, 1, 2, 5, and 10 nm. In these cases, the average strains of the active regions (i.e., a product sum of the strains and thicknesses of the respective layers) are a compressive strain. As indicated in FIG. 3, the maximum light output power increases due to the provision of the strain buffer layers. However, when the thickness of each strain buffer layer reaches approximately 10 nm, the effect of the strain buffer layer diminishes. This is considered to be because the effective strain in the quantum well layer increases. Practically, in consideration of the maximum light output power and the control of the thickness, the preferable thickness of the strain buffer layer is about 1 to 5 nm.

In order to avoid occurrence of a defect due to the strains of the crystals, it is preferable that the sum of the first product of the strain Δa and the thickness da of the quantum well layer, the second product of the strain Δb and the thickness db of the barrier layer, and the third product of the strain Δr and the thickness dr of the strain buffer layer is 0.08 nm or smaller. That is, a preferable relationship between the strains and thicknesses of the respective layers of the active region is, $$0 \leq \Delta a \cdot da + 2\Delta b \cdot db + 2\Delta r \cdot dr \leq 0.08 \text{ nm}.$$

In addition, the amount of the strain of the strain buffer layer is between the amounts of the strains of the quantum well layer and the barrier layer, i.e., Δb<Δr<Δa. Further, the strain of the strain buffer layer is a compressive strain, i.e., Δr>0.

Furthermore, the active region may have a multiple quantum well structure. FIG. 2B is a magnified cross-sectional view of an example of the active region of a semiconductor laser device including multiple quantum well layers. Similar to the single quantum well structure, the barrier layers B are formed in alternation with the quantum well layers A so that both of the outermost layers of the alternating layers are the barrier layers B, and a barrier layer R is formed between each quantum well layer A and each of two barrier layers B adjacent to the quantum well layer A. In the case where the number of the quantum well layers A is N, a preferable relationship between the strains and thicknesses of the respective layers of the active region is, $$0 \leq N \cdot \Delta a \cdot da + (N+1) \cdot \Delta b \cdot db + 2N \cdot \Delta r \cdot dr \leq 0.08 \text{ nm}.$$

The above relationship is also preferable in the semiconductor laser devices as the second to seventh embodiments, which are explained below.

Second Embodiment

The construction of a semiconductor laser device as the second embodiment of the present invention and a process for producing the semiconductor laser device are explained below with reference to FIGS. 4A to 4C, which are cross-sectional views of representative stages in the process of producing a semiconductor laser device as the second embodiment, where the cross sections are perpendicular to the direction of light emitted from the semiconductor laser device.

As illustrated in FIG. 4A, first, an n-type $In_{x8}Ga_{1-x8}P$ lower cladding layer 22 (x8=0.49±0.01), an n-type or i-type (intrinsic) $In_{x4}Ga_{1-x4}As_{1-y4}P_{y4}$ lower optical waveguide layer 23 (x4=(0.49±0.01)y4, 0≦x4≦0.3), an $In_{x3}Ga_{1-x3}As_{1-y3}P_{y3}$ tensile-strain barrier layer 24 (0≦x3<0.49y3, 0<y3≦0.5) having a thickness of approximately 5 to 20 nm, an $In_{x2}Ga_{1-x2}As_{1-y2}P_{y2}$ strain buffer layer 25 (0≦x2<0.4, 0≦y2<0.5) having a thickness of approximately 1 to 5 nm, an $In_{x1}Ga_{1-x1}As_{1-y1}P_{y1}$ compressive-strain quantum well layer 26 (0.4≧x1>0.49y1, 0≦y1≦0.1) having a thickness of approximately 3 to 20 nm, an $In_{x2}Ga_{1-x2}As_{1-y2}P_{y2}$ strain buffer layer 27, an $In_{x3}Ga_{1-x3}As_{1-y3}P_{y3}$ tensile-strain barrier layer 28, a p-type or i-type $In_{x4}Ga_{1-x4}As_{1-y4}P_{y4}$ upper optical waveguide layer 29, a p-type GaAs first etching stop layer 30, a p-type $In_{x5}Ga_{1-x5}P$ second etching stop layer 31 (0≦x5≦1) having a thickness of approximately 5 to 20 nm, an n-type $Al_{z2}Ga_{1-z2}As$ current confinement layer 32 (0<z2≦0.8), and an n-type GaAs cap layer 33 having a thickness of approximately 10 nm are formed on an n-type GaAs substrate 21 by organometallic vapor phase epitaxy. Then, a $SiO_2$ film 34 is formed over the n-type GaAs cap layer 33, and a stripe area of the $SiO_2$ film 34 having a width of about 2 to 4 micrometers and extending in the <011> direction is removed by a conventional lithography technique.

Figure 4B:
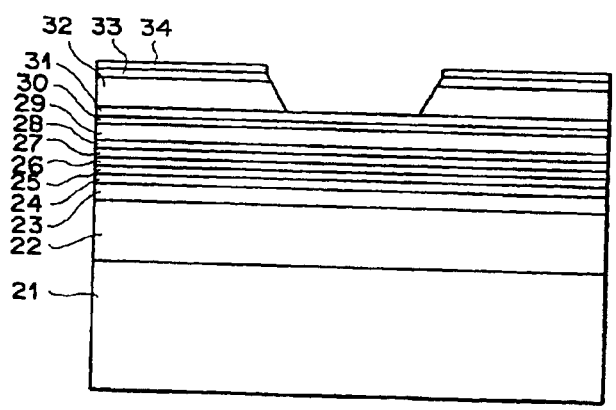

Next, in order to form a stripe groove as illustrated in FIG. 4B, the n-type GaAs cap layer 33 and the n-type $Al_{z2}Ga_{1-z2}As$ current confinement layer 32 are etched with a sulfuric acid etchant by using the $SiO_2$ film 34 as a mask until a stripe area of the p-type $In_{x5}Ga_{1-x5}P$ second etching stop layer 31 is exposed. Then, the exposed area of the p-type $In_{x5}Ga_{1-x5}P$ second etching stop layer 31 is etched with a hydrochloric acid etchant until a stripe area of the p-type GaAs first etching stop layer 30 is exposed.

Figure 4C:
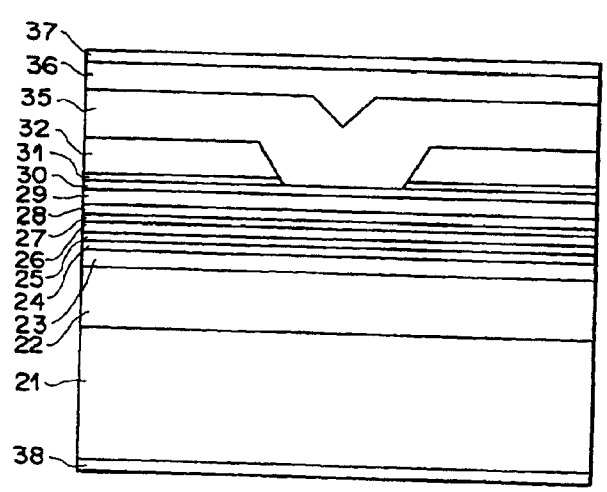

Thereafter, as illustrated in FIG. 4C, the remaining areas of the $SiO_2$ film 34 are removed by a fluoric acid etchant. Then, a p-type $Al_{z2}Ga_{1-z1}As$ upper cladding layer 35 (0<z1≦0.7 and z1<z2) and a p-type GaAs contact layer 36 are formed over the above construction. Next, a p electrode 37 is formed on the p-type GaAs contact layer 36. In addition, the exposed surface of the substrate 21 is polished, and an n electrode 38 is formed on the polished surface of the substrate 21. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type or i-type $In_{x4}Ga_{1-x4}As_{1-y4}P_{y4}$ upper optical waveguide layer 29 has such a thickness that oscillation in the fundamental transverse mode can be maintained even when the semiconductor laser device operates with high output power. In addition, a difference in an equivalent refractive index between a portion of the active region under the stripe groove and another portion of the active region which is not located under the stripe groove is in a range from $1.5 \times 10^{-3}$ to $7 \times 10^{-3}$. Alternatively, the n-type lower cladding layer 22 may be made of $Al_{z1}Ga_{1-z1}As$ (0<z1≦0.7 and z1<z2).

Third Embodiment

The construction of a semiconductor laser device as the third embodiment of the present invention and a process for producing the semiconductor laser device are explained below with reference to FIG. 5, which is a cross-sectional view of the semiconductor laser device as the third embodiment, where the cross section is perpendicular to the direction of light emitted from the semiconductor laser device.

Figure 5:
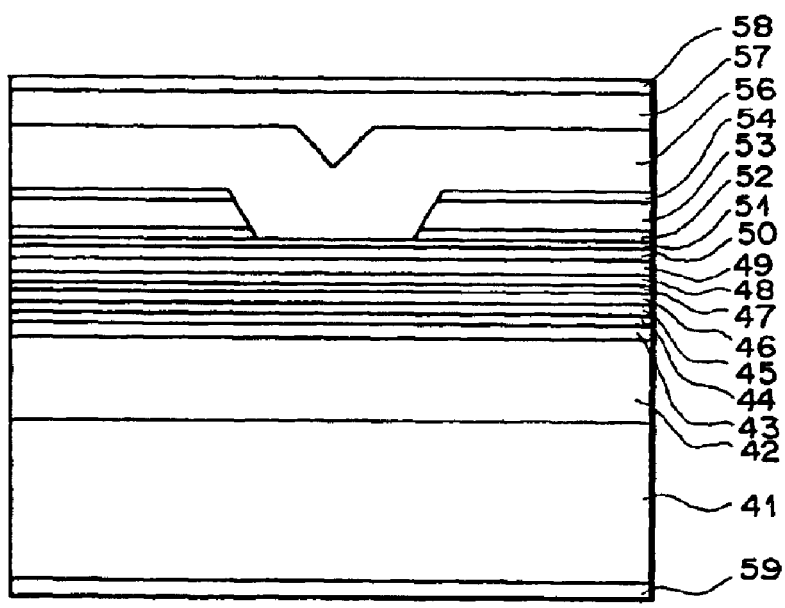
FIG. 5 is a cross-sectional view of a semiconductor laser device as the third embodiment.

As illustrated in FIG. 5, first, an n-type $Al_{z1}Ga_{1-z1}As$ lower cladding layer 42 ($0<z1\leq0.7$), an n-type or i-type (intrinsic) $Al_{z3}Ga_{1-z3}As$ lower optical waveguide layer 43 ($0\leq z3\leq0.3$, $z3<z1$), an $In_{x3}Ga_{1-x3}As_{1-y3}P_{y3}$ tensile-strain barrier layer 44 ($0\leq x3<0.49y3$, $0<y3\leq0.5$) having a thickness of approximately 5 to 20 nm, an $In_{x2}Ga_{1-x2}As_{1-y2}P_{y2}$ strain buffer layer 45 ($0\leq x2\leq0.4$, $0\leq y2\leq0.5$) having a thickness of approximately 1 to 5 nm, an $In_{x1}Ga_{1-x1}As_{1-y1}P_{y1}$ compressive-strain quantum well layer 46 ($0.4\geq x1>0.49y1$, $0\leq y1\leq0.1$) having a thickness of approximately 3 to 20 nm, an $In_{x2}Ga_{1-x2}As_{1-y2}P_{y2}$ strain buffer layer 47, an $In_{x3}Ga_{1-x3}As_{1-y3}P_{y3}$ tensile-strain barrier layer 48, a p-type or i-type $Al_{z3}Ga_{1-z3}As$ upper optical waveguide layer 49, a p-type $Al_{z1}Ga_{1-z1}As$ first upper cladding layer 50, a p-type GaAs first etching stop layer 51, a p-type $In_{x5}Ga_{1-x5}P$ second etching stop layer 52 ($0\leq x5\leq1$) having a thickness of approximately 5 to 20 nm, an n-type $Al_{z2}Ga_{1-z2}As$ current confinement layer 53 ($z1<z2\leq0.8$) having a thickness of 1 micrometer, and an n-type GaAs cap layer 54 having a thickness of approximately 10 nm are formed on an n-type GaAs substrate 41 by organometallic vapor phase epitaxy. Then, a $SiO_2$ film (not shown) is formed over the n-type GaAs cap layer 54, and a stripe area of the $SiO_2$ film having a width of about 2 to 4 micrometers and extending in the <011> direction is removed by a conventional lithography technique.

Next, in order to form a stripe groove, the n-type GaAs cap layer 54 and the n-type $Al_{z2}Ga_{1-z2}As$ current confinement layer 53 are etched with a sulfuric acid etchant by using the $SiO_2$ film as a mask until a stripe area of the p-type $In_{x5}Ga_{1-x5}P$ second etching stop layer 52 is exposed. Then, the exposed area of the p-type $In_{x5}Ga_{1-x5}P$ second etching stop layer 52 is etched with a hydrochloric acid etchant until a stripe area of the p-type GaAs first etching stop layer 51 is exposed.

Thereafter, the remaining areas of the above $SiO_2$ film are removed by a fluoric acid etchant. Then, a p-type $Al_{z1}Ga_{1-z1}As$ second upper cladding layer 56 and a p-type GaAs contact layer 57 are formed over the above construction. Next, a p electrode 58 is formed on the p-type GaAs contact layer 57. In addition, the exposed surface of the substrate 41 is polished, and an n electrode 59 is formed on the polished surface of the substrate 41. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the total thickness of the p-type or i-type $Al_{z3}Ga_{1-z3}As$ upper optical waveguide layer 49 and the p-type $Al_{z1}Ga_{1-z1}As$ first upper cladding layer 50 is so arranged that oscillation in the fundamental transverse mode can be maintained even when the semiconductor laser device operates with high output power. In addition, a difference in an equivalent refractive index between a portion of the active region under the stripe groove and another portion of the active region which is not located under the stripe groove is in a range from $1.5\times10^{-3}$ to $7\times10^{-3}$.

Fourth Embodiment

The construction of a semiconductor laser device as the fourth embodiment of the present invention and a process for producing the semiconductor laser device are explained below with reference to FIG. 6, which is a cross-sectional view of the semiconductor laser device as the fourth embodiment, where the cross section is perpendicular to the direction of light emitted from the semiconductor laser device.

Figure 6:
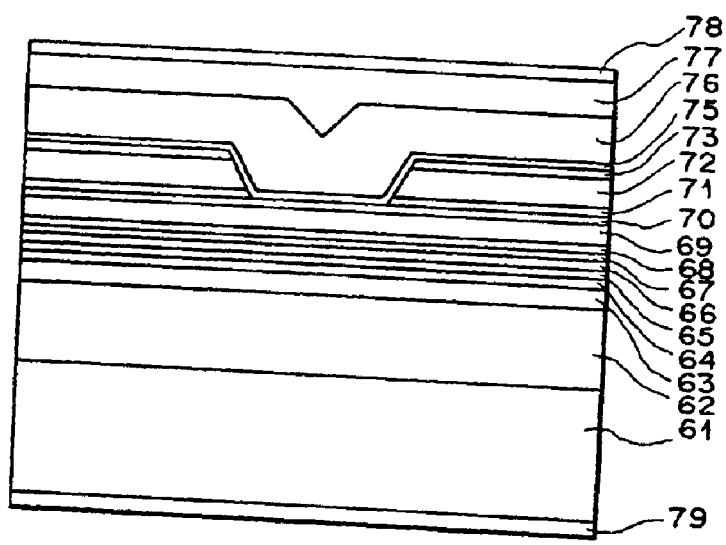
FIG. 6 is a cross-sectional view of a semiconductor laser device as the fourth embodiment.

As illustrated in FIG. 6, first, an n-type $Al_{z1}Ga_{1-z1}As$ lower cladding layer 62 ($0<z1\leq0.7$), an n-type or i-type (intrinsic) $Al_{z3}Ga_{1-z3}As$ lower optical waveguide layer 63 ($0\leq z3\leq0.3$ and $z3<z1$), an $In_{x3}Ga_{1-x3}As_{1-y3}P_{y3}$ tensile-strain barrier layer 64 ($0\leq x3<0.49y3$, $0<y3\leq0.5$) having a thickness of approximately 5 to 20 nm, an $In_{x2}Ga_{1-x2}As_{1-y2}P_{y2}$ strain buffer layer 65 ($0\leq x2\leq0.4$, $0\leq y2\leq0.5$) having a thickness of approximately 1 to 5 nm, an $In_{x1}Ga_{1-x1}As_{1-y1}P_{y1}$ compressive-strain quantum well layer 66 ($0.4\geq x1>0.49y1$, $0\leq y1\leq0.1$) having a thickness of approximately 3 to 20 nm, an $In_{x2}Ga_{1-x2}As_{1-y2}P_{y2}$ strain buffer layer 67, an $In_{x3}Ga_{1-x3}As_{1-y3}P_{y3}$ tensile-strain barrier layer 68, a p-type or i-type $Al_{z3}Ga_{1-z3}As$ first upper optical waveguide layer 69, a p-type GaAs first etching stop layer 70, a p-type $In_{x5}Ga_{1-x5}P$ second etching stop layer 71 ($0\leq x5\leq1$) having a thickness of approximately 5 to 20 nm, an n-type $Al_{z2}Ga_{1-z2}As$ current confinement layer 72 ($z1<z2\leq0.8$) having a thickness of 1 micrometer, and an n-type GaAs cap layer 73 having a thickness of approximately 10 nm are formed on an n-type GaAs substrate 61 by organometallic vapor phase epitaxy. Then, a $SiO_2$ film (not shown) is formed over the n-type GaAs cap layer 73, and a stripe area of the $SiO_2$ film having a width of about 2 to 4 micrometers and extending in the <011> direction is removed by a conventional lithography technique.

Next, in order to form a stripe groove, the n-type GaAs cap layer 73 and the n-type $Al_{z2}Ga_{1-z2}As$ current confinement layer 72 are etched with a sulfuric acid etchant by using the $SiO_2$ film (not shown) as a mask until a stripe area of the p-type $In_{x5}Ga_{1-x5}P$ second etching stop layer 71 is exposed. Then, the exposed area of the p-type $In_{x5}Ga_{1-x5}P$ second etching stop layer 71 is etched with a hydrochloric acid etchant until a stripe area of the p-type GaAs first etching stop layer 70 is exposed.

Thereafter, the remaining areas of the above $SiO_2$ film are removed by a fluoric acid etchant. Then, a p-type $Al_{z3}Ga_{1-z3}As$ second upper optical waveguide layer 75, a p-type $Al_{z1}Ga_{1-z1}As$ upper cladding layer 76, and a p-type GaAs contact layer 77 are formed over the above construction. Next, a p electrode 78 is formed on the p-type GaAs contact layer 77. In addition, the exposed surface of the substrate 61 is polished, and an n electrode 79 is formed on the polished surface of the substrate 61. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type or i-type $Al_{z3}Ga_{1-z3}As$ first upper optical waveguide layer 69 has such a thickness that oscillation in the fundamental transverse mode can be maintained even when the semiconductor laser device operates with high output power. In addition, a difference in an equivalent refractive index between a portion of the active region under the stripe groove and another portion of the active region which is not located under the stripe groove is in a range from $1.5\times10^{-3}$ to $7\times10^{-3}$.

Fifth Embodiment

The construction of a semiconductor laser device as the fifth embodiment of the present invention and a process for producing the semiconductor laser device are explained below with reference to FIG. 7, which is a cross-sectional view of the semiconductor laser device as the fifth embodiment, where the cross section is perpendicular to the direction of light emitted from the semiconductor laser device.

Figure 7:
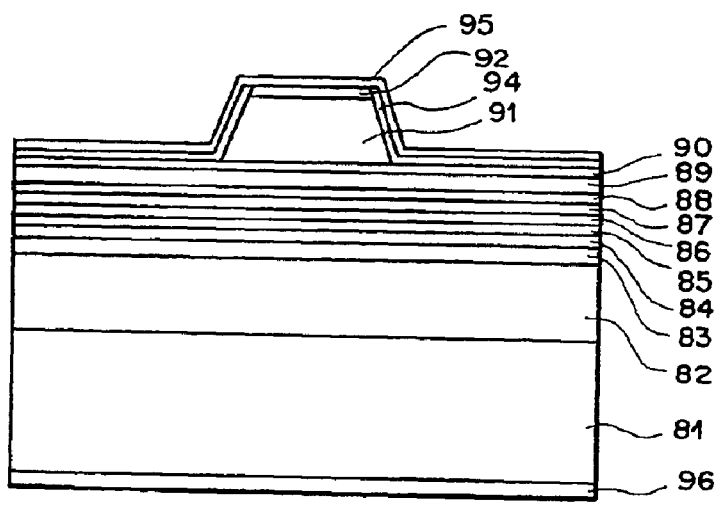
FIG. 7 is a cross-sectional view of a semiconductor laser device as the fifth embodiment.

As illustrated in FIG. 7, first, an n-type $Al_{z1}Ga_{1-z1}As$ lower cladding layer 82 ($0<z1\leq0.7$), an n-type or i-type (intrinsic) $In_{x4}Ga_{1-x4}As_{1-y4}P_{y4}$ optical waveguide layer 83 ($x4=(0.49\pm0.01)y4$, $0\leq x4\leq0.3$), an $In_{x3}Ga_{1-x3}As_{1-y3}P_{y3}$ tensile-strain barrier layer 84 ($0\leq x3<0.49y3$, $0<y3\leq0.5$) having a thickness of approximately 5 to 20 nm, an $In_{x2}Ga_{1-x2}As_{1-y2}P_{y2}$ strain buffer layer 85 ($0\leq x2\leq0.4$, $0\leq y2\leq0.5$) having a thickness of approximately 1 to 5 nm, an $In_{x1}Ga_{1-x1}As_{1-y1}P_{y1}$ compressive-strain quantum well layer 86 ($0.4\geq x1>0.49y1$, $0\leq y1\leq0.1$) having a thickness of approximately 3 to 20 nm, an $In_{x2}Ga_{1-x2}As_{1-y2}P_{y2}$ strain buffer layer 87, an $In_{x3}Ga_{1-x3}As_{1-y3}P_{y3}$ tensile-strain barrier layer 88, a p-type or i-type $In_{x4}Ga_{1-x4}As_{1-y4}P_{y4}$ optical waveguide layer 89, a p-type $In_{x5}Ga_{1-x5}P$ etching stop layer 90 ($0\leq x5\leq1$) having a thickness of approximately 5 to 20 nm, a p-type $Al_{z1}Ga_{1-z1}As$ upper cladding layer 91, and a p-type GaAs contact layer 92 are formed on an n-type GaAs substrate 81 by organometallic vapor phase epitaxy. Then, a $SiO_2$ first insulation film (not shown) is formed over the p-type GaAs contact layer 92, and parallel stripe areas of the first insulation film, each having a width of about 10 micrometers, are removed by a conventional lithography technique. Next, in order to form a ridge stripe structure, the parallel stripe areas of the above layered structure are etched to the depth of the upper surface of the p-type $In_{x5}Ga_{1-x5}P$ etching stop layer 90 by wet etching using the remaining areas of the first insulation film as a mask. When a solution of sulfuric acid and hydrogen peroxide is used as an etchant, the etching automatically stops at the upper boundary of the p-type $In_{x5}Ga_{1-x5}P$ etching stop layer 90. Thereafter, the remaining areas of the first insulation film are removed, and then a second insulation film 94 is formed over the ridge stripe structure. Next, a stripe portion of the second insulation film 94 on the top of the ridge stripe structure is removed by a conventional lithography technique so as to expose a stripe area of the p-type GaAs contact layer 92 and form a current injection window. Next, a p electrode 95 is formed on the exposed stripe area of the p-type GaAs contact layer 92. In addition, the exposed surface of the substrate 81 is polished, and an n electrode 96 is formed on the polished surface of the substrate 81. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type or i-type $In_{x4}Ga_{1-x4}As_{1-y4}P_{y4}$ optical waveguide layer 89 has such a thickness that oscillation in the fundamental transverse mode can be maintained even when the semiconductor laser device operates with high output power. In addition, a difference in an equivalent refractive index between a portion of the active region under the current injection window and another portion of the active region which is not located under the current injection window is in a range from $1.5\times10^{-3}$ to $7\times10^{-3}$.

Sixth Embodiment

The construction of a semiconductor laser device as the sixth embodiment of the present invention and a process for producing the semiconductor laser device are explained below with reference to FIG. 8, which is a cross-sectional view of the semiconductor laser device as the sixth embodiment, where the cross section is perpendicular to the direction of light emitted from the semiconductor laser device.

Figure 8:
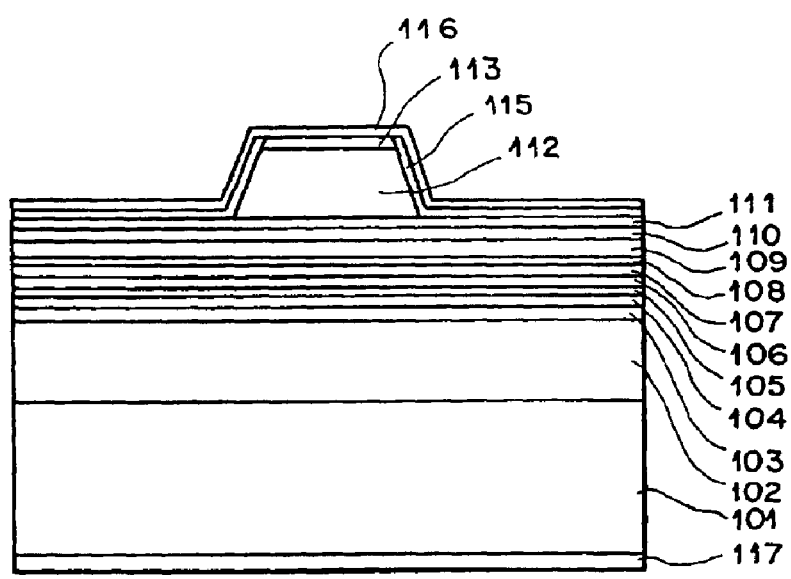
FIG. 8 is a cross-sectional view of a semiconductor laser device as the sixth embodiment.

As illustrated in FIG. 8, first, an n-type $Al_{z1}Ga_{1-z1}As$ lower cladding layer 102 ($0<z1\leq0.7$), an n-type or i-type (intrinsic) $Al_{z3}Ga_{1-z3}As$ optical waveguide layer 103 ($0\leq z3\leq0.3$ and $z3<z1$), an $In_{x3}Ga_{1-x3}As_{1-y3}P_{y3}$ tensile-strain barrier layer 104 ($0\leq x3<0.49y3$, $0<y3\leq0.5$) having a thickness of approximately 5 to 20 nm, an $In_{x2}Ga_{1-x2}As_{1-y2}P_{y2}$ strain buffer layer 105 ($0\leq x2\leq0.4$, $0\leq y2\leq0.5$) having a thickness of approximately 1 to 5 nm, an $In_{x1}Ga_{1-x1}As_{1-y1}P_{y1}$ compressive-strain quantum well layer 106 ($0.4\geq x1>0.49y1$, $0\leq y1\leq0.1$) having a thickness of approximately 3 to 20 nm, an $In_{x2}Ga_{1-x2}As_{1-y2}P_{y2}$ strain buffer layer 107, an $In_{x3}Ga_{1-x3}As_{1-y3}P_{y3}$ tensile-strain barrier layer 108, a p-type or i-type $Al_{z3}Ga_{1-z3}As$ optical waveguide layer 109, a p-type $Al_{z1}Ga_{1-z1}As$ first upper cladding layer 110, a p-type $In_{x5}Ga_{1-x5}P$ etching stop layer 111 ($0\leq x5\leq1$) having a thickness of approximately 5 to 20 nm, a p-type $Al_{z1}Ga_{1-z1}As$ second upper cladding layer 112, and a p-type GaAs contact layer 113 are formed on an n-type GaAs substrate 101 by organometallic vapor phase epitaxy. Then, a first insulation film (not shown) is formed over the p-type GaAs contact layer 113, and parallel stripe areas of the first insulation film, each having a width of about 10 micrometers, are removed by a conventional lithography technique. Next, in order to form a ridge stripe structure, the parallel stripe areas of the above layered structure are etched to the depth of the upper surface of the p-type $In_{x5}Ga_{1-x5}P$ etching stop layer lll by wet etching using the remaining areas of the first insulation film as a mask. When a solution of sulfuric acid and hydrogen peroxide is used as an etchant, the etching automatically stops at the upper boundary of the p-type $In_{x5}Ga_{1-x5}P$ etching stop layer 111. Thereafter, the remaining areas of the first insulation film are removed, and then a second insulation film 115 is formed over the ridge stripe structure. Next, a stripe portion of the second insulation film 115 on the top of the ridge stripe structure is removed by a conventional lithography technique so as to expose a stripe area of the p-type GaAs contact layer 113 and form a current injection window. Next, a p electrode 116 is formed on the exposed stripe area of the p-type GaAs contact layer 113. In addition, the exposed surface of the substrate 101 is polished, and an n electrode 117 is formed on the polished surface of the substrate 101. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the total thickness of the p-type or i-type $Al_{z3}Ga_{1-z3}As$ optical waveguide layer 109 and the p-type $Al_{z1}Ga_{1-z1}As$ first upper cladding layer 110 is so arranged that oscillation in the fundamental transverse mode can be maintained even when the semiconductor laser device operates with high output power. In addition, a difference in an equivalent refractive index between a portion of the active region under the current injection window and another portion of the active region which is not located under the current injection window is in a range from $1.5\times10^{-3}$ to $7\times10^{-3}$.

Seventh Embodiment

The construction of a semiconductor laser device as the seventh embodiment of the present invention and a process for producing the semiconductor laser device are explained below with reference to FIG. 9, which is a cross-sectional view of the semiconductor laser device as the seventh embodiment, where the cross section is perpendicular to the direction of light emitted from the semiconductor laser device.

Figure 9:
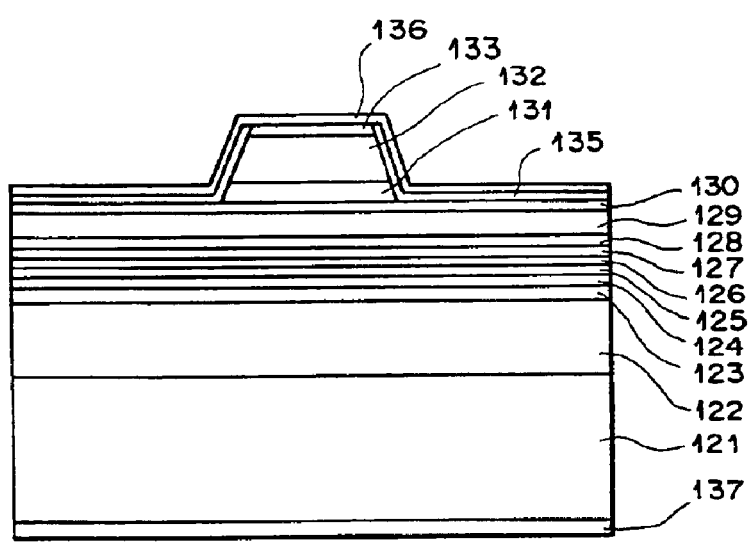
FIG. 9 is a cross-sectional view of a semiconductor laser device as the seventh embodiment.

As illustrated in FIG. 9, first, an n-type $Al_{z1}Ga_{1-z1}As$ lower cladding layer 122 ($0<z1\leq0.7$), an n-type or i-type (intrinsic) $Al_{z3}Ga_{1-z3}As$ optical waveguide layer 123 ($0\leq z3\leq0.3$ and $z3<z1$), an $In_{x3}Ga_{1-x3}As_{1-y3}P_{y3}$ tensile-strain barrier layer 124 ($0\leq x3<0.49y3$, $0<y3\leq0.5$) having a thickness of approximately 5 to 20 nm, an $In_{x2}Ga_{1-x2}As_{1-y2}P_{y2}$ strain buffer layer 125 ($0\leq x2\leq0.4$, $0\leq y2\leq0.5$) having a thickness of approximately 1 to 5 nm, an $In_{x1}Ga_{1-x1}As_{1-y1}P_{y1}$ compressive-strain quantum well layer 126 ($0.4\geq x1>0.49y1$, $0\leq y1<0.1$) having a thickness of approximately 3 to 20 nm, an $In_{x2}Ga_{1-x2}As_{1-y2}P_{y2}$ strain buffer layer 127, an $In_{x3}Ga_{1-x3}As_{1-y3}P_{y3}$ tensile-strain barrier layer 128, a p-type or i-type $Al_{z3}Ga_{1-z3}As$ first upper optical waveguide layer 129, a p-type $In_{x5}Ga_{1-x5}P$ etching stop layer 130 ($0\leq x5\leq1$) having a thickness of approximately 5 to 20 nm, a p-type $Al_{z3}Ga_{1-z3}As$ second upper optical waveguide layer 131, a p-type $Al_{z1}Ga_{1-z1}As$ upper cladding layer 132, and a p-type GaAs contact layer 133 are formed on an n-type GaAs substrate 121 by organometallic vapor phase epitaxy. Then, a first insulation film (not shown) is formed over the p-type GaAs contact layer 133, and parallel stripe areas of the first insulation film, each having a width of about 10 micrometers, are removed by a conventional lithography technique. Next, in order to form a ridge stripe structure, the parallel stripe areas of the above layered structure are etched to the depth of the upper surface of the p-type $In_{x5}Ga_{1-x5}P$ etching stop layer 130 by wet etching using the remaining areas of the first insulation film as a mask. When a solution of sulfuric acid and hydrogen peroxide is used as an etchant, the etching automatically stops at the upper boundary of the p-type $In_{x5}Ga_{1-x5}P$ etching stop layer 130. Thereafter, the remaining areas of the first insulation film are removed, and then a second insulation film 135 is formed over the ridge stripe structure. Next, a stripe portion of the second insulation film 135 on the top of the ridge stripe structure is removed by a conventional lithography technique so as to expose a stripe area of the p-type GaAs contact layer 133 and form a current injection window. Next, a p electrode 136 is formed on the exposed stripe area of the p-type GaAs contact layer 133. In addition, the exposed surface of the substrate 121 is polished, and an n electrode 137 is formed on the polished surface of the substrate 121. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type or i-type $Al_{z3}Ga_{1-z3}As$ first upper optical waveguide layer 129 has such a thickness that oscillation in the fundamental transverse mode can be maintained even when the semiconductor laser device operates with high output power. In addition, a difference in an equivalent refractive index between a portion of the active region under the current injection window and another portion of the active region which is not located under the current injection window is in a range from $1.5\times10^{-3}$ to $7\times10^{-3}$.

Additional Matters (i) In the constructions of the first to seventh embodiments, the respective cladding layers may be made of $In_{x7}(Al_{z7}Ga_{1-z7})_{1-x7}P$ ($x7=0.49\pm0.01$, $0\leq z7\leq1$).

(ii) Although the present invention is applied to the index-guided semiconductor laser devices in the first to seventh embodiments, the present invention can also be applied to other semiconductor laser devices having a diffraction lattice, and further to optical integrated circuits.

(iii) Although n-type GaAs substrates are used in the constructions of the first to seventh embodiments, instead, p-type GaAs substrates may be used. When the GaAs substrate is a p-type in each embodiment, the conductivity types of all of the other layers in the construction of the embodiment should be inverted.

(iv) In the second to seventh embodiments, the processes for producing semiconductor laser devices which oscillate in a fundamental transverse mode are explained. However, the processes disclosed for the second to seventh embodiments can also be used in production of broad-stripe, index-guided semiconductor laser devices which have a stripe width of 4 micrometers or greater and an equivalent refractive index of $1.5\times10^{-3}$ or greater, and oscillate in multiple modes. Since the above semiconductor laser devices which oscillate in multiple modes have a low-noise characteristic, it is possible to realize devices which can be used in excitation of solid-state lasers or the like.

(v) Due to the $In_{x1}Ga_{1-x1}As_{1-y1}P_{y1}$ compressive strain quantum well active layers, the oscillation wavelengths of the semiconductor laser devices as the first to seventh embodiments can be controlled in the range of 900 to 1,200 nm.

(vi) Each layer in the constructions of the first to seventh embodiments may be formed by molecular beam epitaxy using solid or gas raw material.

What is claimed is:

1. A semiconductor laser device comprising an active region which includes alternating layers of at least one quantum well layer and a plurality of barrier layers, where two of the plurality of barrier layers are outermost layers of said alternating layers, each of said at least one quantum well layer has a first thickness da and a compressive strain $\Delta a$, and each of said plurality of barrier layers has a second thickness db and a tensile strain $\Delta b$;

in said active region, a strain buffer layer is formed between each of said at least one quantum well layer and each of two of said plurality of barrier layers adjacent to said each of said at least one quantum well layer, where each strain buffer layer has a third thickness dr and an intermediate compressive strain $\Delta r$ which is between said compressive strain $\Delta a$ and said tensile strain $\Delta b$; and said first thickness da, said compressive strain $\Delta a$, said second thickness db, said tensile strain $\Delta b$, said third thickness dr, and said intermediate strain $\Delta r$ satisfy a relationship $$0.012 \leq N\cdot\Delta a\cdot da + (N+1)\cdot\Delta b\cdot db + 2N\cdot\Delta r\cdot dr \leq 0.04 \text{ nm},$$

where N is the number of said at least one quantum.

2. A semiconductor laser device according to claim 1, wherein said at least one quantum well layer is made of $In_{x1}Ga_{1-x1}As_{1-y1}P_{y1}$, each of said plurality of strain buffer layers has a thickness of approximately 1 to 5 nm, and is made of $In_{x2}Ga_{1-x2}As_{1-y2}P_{y2}$, and each of said plurality of barrier layers has a thickness of approximately 5 to 20 nm, and is made of $In_{x3}Ga_{1-x3}As_{1-y3}P_{y3}$, where $0.4\geq x1>0.49y1$, $0\leq y1\leq0.1$, $0\leq x2\leq0.4$, $0\leq y2\leq0.5$, $0\leq x3<0.49y3$, and $0<y3\leq0.5$.

3. A semiconductor laser device according to claim 1, wherein N+1 is the number of barrier layers of said plurality of barrier layers, and 2N is the number of strain buffer layers, and wherein an average strain of the active region is 0.04 nm, said average strain being compressive strain.

4. A semiconductor device according to claim 1, wherein said at least one quantum well layer is two or more quantum well layers, N being greater than or equal to 2, and wherein an average strain of the active region is 0.04 nm, said average strain being compressive strain.

5. A semiconductor device according to claim 1, wherein each strain buffer layer in said active region is immediately adjacent to, and in direct contact with, a barrier layer of said plurality of barrier layers and a quantum well layer of said at least one quantum well layer, the strain buffer layer being between the barrier layer and the quantum well layer.

6. A semiconductor laser device according to claim 1, wherein said active region has an oscillation wavelength in the range of 900 to 1,200 nm.

7. A semiconductor laser device according to claim 1, wherein an average strain of said active region is compressive strain.

8. A semiconductor laser device according to claim 1, further comprising an upper optical waveguide layer formed on or above said active region, and a lower optical waveguide layer formed under said active region, and each of said upper optical waveguide layer and said lower optical waveguide layer is made of $In_{x4}Ga_{1-x4}As_{1-y4}P_{y4}$ or $Al_{z3}Ga_{1-z3}As$, where $x4=(0.49\pm0.01)y4$, $0\leq x4\leq 0.3$, and $0\leq z3\leq 0.3$.

9. A semiconductor laser device according to claim 8, further comprising an upper cladding layer formed on or above said upper optical waveguide layer, and a lower cladding layer formed under said lower optical waveguide layer, and each of said upper cladding layer and said lower cladding layer is made of $In_{x7}(Al_{z7}Ga_{1-z7})_{1-x7}P$ or $Al_{z1}Ga_{1-z1}As$ or $In_{x8}Ga_{1-x8}P$, where $x7=0.49\pm0.01$, $0\leq z7\leq 1$, $0.2\leq z1\leq 0.7$, and $x8=0.49\pm0.01$.

10. A semiconductor laser device according to claim 1, further comprising a current confinement layer above said active region, where said current confinement layer has an opening having a stripe shape and realizing a current injection window.

11. A semiconductor laser device according to claim 10, wherein said current injection window has a width equal to or greater than 2 micrometers and less than 4 micrometers, and realizes a difference in an equivalent refractive index between a portion of said active region under said current injection window and another portion of said active region under said current confinement layer except for said current injection window is in a range from $1.5\times 10^{-3}$ to $7\times 10^{-3}$.

12. A semiconductor laser device according to claim 10, wherein said current injection window has a width equal to or greater than 4 micrometers, and realizes a difference in an equivalent refractive index between a portion of said active region under said current injection window and another portion of said active region under said current confinement layer except for said current injection window is equal to or greater than $1.5\times 10^{-3}$.

13. A semiconductor laser device according to claim 1, further comprising a ridge structure above said active region, where said ridge structure includes a current path.

14. A semiconductor laser device according to claim 13, wherein said current path has a width equal to or greater than 2 micrometers and less than 4 micrometers, and realizes a difference in an equivalent refractive index between a portion of said active region under said current path and another portion of said active region which is not located under said current path is in a range from $1.5\times 10^{-3}$ to $7\times 10^{-3}$.

15. A semiconductor laser device according to claim 13, wherein said current path has a width equal to or greater than 4 micrometers, and realizes a difference in an equivalent refractive index between a portion of said active region under said current path and another portion of said active region which is not located under said current path is equal to or greater than $1.5\times 10^{-3}$.

16. A semiconductor laser device comprising an active region, said active region including alternating layers comprising:

at least one quantum well layer, each of said at least one quantum well layer having a compressive strain $\Delta a$;

a plurality of barrier layers, each of said plurality of barrier layers having a tensile strain $\Delta b$; and a plurality of strain buffer layers, each strain buffer layer having an intermediate compressive strain $\Delta r$, said compressive strain $\Delta a$, said tensile strain $\Delta b$, and said intermediate strain $\Delta r$ satisfying a relationship $\Delta a<\Delta r<\Delta b$, wherein two of the plurality of barrier layers are outermost layers of said alternating layers, wherein, if said at least one quantum well layer is more than on, there is a barrier layer of said plurality of barrier layers between each quantum well layer, and wherein there is a strain buffer layer of said plurality of strain buffer layers between each quantum well layer and barrier layer.

17. A semiconductor laser device according to claim 16, wherein:

each of said at least one quantum well layer has a first thickness da, each of said plurality of barrier layers has a second thickness db, each strain buffer layer has a third thickness dr, and said first thickness da, said compressive strain $\Delta a$, said second thickness db, said tensile strain $\Delta b$, said third thickness dr, and said intermediate strain $\Delta r$ satisfying a relationship:

$$0.012\leq N\cdot\Delta a\cdot da+(N+1)\cdot\Delta b\cdot db+2N\,\Delta r\cdot dr\leq 0.04 \text{ nm},$$

wherein said at least one quantum well layer are N in number, and $N\geq 1$.

18. A semiconductor device according to claim 16, wherein said at least one quantum well layer is two or more quantum well layers.

19. A semiconductor device according to claim 16, wherein each strain buffer layer in said active region is immediately adjacent to, and in direct contact with, a barrier layer of said plurality of barrier layers and a quantum well layer of said at least one quantum well layer, the strain buffer layer being between the barrier layer and the quantum well layer.

20. A semiconductor laser device according to claim 16, wherein an average strain of said active region is compressive strain.

21. The device of claim 16, the strain buffer layer is made up of $In_{x2}Ga_{1-x2}As_{1-y2}P_{y2}$ where $0<_{y2}\leq 0.5$, $0<x2\leq 0.4$ 22. A semiconductor laser device according to claim 16, wherein:

said at least one quantum well layer are N in number, wherein $N\geq 1$, said plurality of barrier layers are N+1 in number, and said plurality of strain buffer layers are 2N in number.

23. A semiconductor laser device according to claim 22, wherein:

each of said at least one quantum well layer has a first thickness da, each of said plurality of barrier layers has a second thickness db, each strain buffer layer has a third thickness dr, and said first thickness da, said compressive strain $\Delta a$, said second thickness db, said tensile strain $\Delta b$, said third thickness dr, and said intermediate strain $\Delta r$ satisfying a relationship:

$$0.012 \leq N \cdot \Delta a \cdot da + (N+1) \cdot \Delta b \cdot db + 2N \cdot \Delta r \cdot dr \leq 0.04 \text{ nm}.$$

24. A semiconductor laser device comprising an active region which consists of alternating layers of at least one quantum well layer and a plurality of barrier layers, where two of the plurality of barrier layers are outermost layers of said alternating layers, each of said at least one quantum well layer has a first thickness da and a compressive strain $\Delta a$, and each of said plurality of barrier layers has a second thickness db and a tensile strain $\Delta b$;

in said active region, a strain buffer layer is formed between each of said at least one quantum well layer and each of two of said plurality of barrier layers adjacent to said each of said at least one quantum well layer, where each strain buffer layer has third thickness dr and an intermediate strain compressive $\Delta r$ which is between said compressive strain $\Delta a$ and said tensile strain $\Delta b$;

and said first thickness da, said compressive strain $\Delta a$, said second thickness db, said tensile strain $\Delta b$, said third thickness dr, and said intermediate strain $\Delta r$ satisfy a relationship, $$0.012 \leq N \cdot \Delta a \cdot da + (N+1) \cdot \Delta b \cdot db + 2N \cdot \Delta r \cdot dr \leq 0.04 \text{ nm},$$

where N is the number of said at least one quantum well layer.

25. A semiconductor laser device according to claim 24, wherein an average strain of said active region is compressive strain.

26. The device of claim 24, the strain buffer layer is made up of $In_{x2}Ga_{1-x2}As_{1-y2}P_{y2}$ where $0 <_{y2} \leq 0.5$, $0 < x2 \leq 0.4$.

* * * * *